(12) United States Patent
Osanai (10) Patent No.: US 7,159,310 B2
(45) Date of Patent: Jan. 9, 2007

(54) ELECTRONIC PART MOUNTING SUBSTRATE AND METHOD FOR PRODUCING SAME

(75) Inventor: Hideyo Osanai, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 283 days.

(21) Appl. No.: 10/925,640

(22) Filed: Aug. 24, 2004

(65) Prior Publication Data
US 2005/0047101 A1 Mar. 3, 2005

(30) Foreign Application Priority Data
Aug. 27, 2003 (JP) ............................. 2003-209111

(51) Int. Cl.
*H05K 3/30* (2006.01)

(52) U.S. Cl. .................... 29/841; 29/832; 438/107; 438/108

(58) Field of Classification Search .................. 29/832, 29/841; 438/107, 108
See application file for complete search history.

(56) References Cited

U.S. PATENT DOCUMENTS 6,440,774 B1 * 8/2002 Kobayashi et al. ......... 438/107

2002/0041023 A1 * 4/2002 Sakamoto et al. .......... 257/706

FOREIGN PATENT DOCUMENTS

JP 2002-76551 3/2002

* cited by examiner

*Primary Examiner*—Carl J. Arbes
(74) *Attorney, Agent, or Firm*—Bachman & LaPointe, P.C.

(57) ABSTRACT

In a method for producing an electronic part mounting substrate wherein a heat sinking metal base plate 12 is bonded to one side of a ceramic substrate 10, and one side of a circuit forming metal plate 14 is bonded to the other side thereof, an electronic part 16 being mounted on the other side of the circuit forming metal plate 14, the ceramic substrate 10 and the electronic part 16 are arranged in a mold so that the ceramic substrate 10 is spaced from the electronic part 16, and then, a molten metal is injected into the mold so that the molten metal contacts both sides of the ceramic substrate 10 and the electronic part 16. Then, the mold is cooled to solidify the molten metal, to form a heat sinking metal base plate on one side of the ceramic substrate 10 so that the heat sinking metal base plate is bonded directly to the one side of the ceramic substrate 10, and to form a circuit forming metal plate on the other side of the ceramic substrate 10 so that one side of the circuit forming metal plate is bonded directly to the other side of the ceramic substrate 10. When the circuit forming metal plate is formed, the electronic part is bonded directly to the other side of the circuit forming metal plate.

8 Claims, 5 Drawing Sheets

ELECTRONIC PART MOUNTING SUBSTRATE AND METHOD FOR PRODUCING SAME

BACKGROUND OF THE INVENTION

1. Field of the Invention

The present invention generally relates to an electronic part mounting substrate and a method for producing the same. More specifically, the invention relates to an electronic part mounting substrate wherein an electronic part, such as a semiconductor chip, is mounted on a metal/ceramic bonding substrate, and a method for producing the same.

2. Description of the Prior Art

In recent years, power modules are used for controlling heavy-current for electric vehicles, electric railcars, machine tools and so forth. In a conventional power module, a metal/ceramic insulating substrate is fixed to one side of a metal plate or compound material called base plate by soldering, and a semiconductor chip is fixed to the metal/ceramic insulating substrate by soldering. On the other side (reverse) of the base plate, a radiating fin or cooling jacket of a metal is mounted via a thermal conduction grease by means of screws.

Since the soldering of the base plate and semiconductor chip to the metal/ceramic insulating substrate is carried out by heating, the base plate is easy to warp due to the difference in coefficient of thermal expansion between bonding members during soldering. Heat generated from the semiconductor chip passes through the metal/ceramic insulating substrate, solder and base plate to be radiated from the radiating fin or cooling jacket to air or cooling water. Therefore, if the base plate warps during soldering, clearance increases when the radiating fin or cooling jacket is mounted on the base plate, so that there is a problem in that heat sink characteristics extremely deteriorate. Moreover, since the thermal conductivity of the solder itself is low, power modules for heavy-current are desired to have more improved heat sink characteristics.

In order to solve such a problem, there is proposed a metal/ceramic circuit board wherein a base plate of aluminum or an aluminum alloy is bonded directly to a ceramic substrate without soldering the base plate to the ceramic substrate (see, e.g., Japanese Patent Laid-Open No. 2002-76551).

In the metal/ceramic circuit board disclosed in Japanese Patent Laid-Open No. 2002-76551, it is not required to solder the base plate to the metal/ceramic insulating substrate, so that thermal conductivity is improved therebetween. However, it remains being required to solder a semiconductor chip to the metal/ceramic circuit board.

In recent years, it is desired to use lead-free solders. Thus, it is also desired to use a lead-free solder when an electronic part, such as a semiconductor chip, is mounted, by soldering, on the metal/ceramic circuit board disclosed in Japanese Patent Laid-Open No. 2002-76551. However, if a high-temperature solder must be used for soldering the part, it is difficult to use a lead-free solder since an alternative lead-free material having characteristics equal to or better than those of conventional high-temperature solders has not been developed.

If an electronic part, such as a semiconductor chip, is fixed by means of a solder, heat sink characteristics are insufficient since the thermal conductivity of the solder is insufficient. In addition, voids are easily produced, so that there are some cases where heat sink characteristics and reliability deteriorate. Moreover, there are some cases where it is required to improve solder wettability by plating a metal plate before the electronic part is mounted on the metal plate by soldering, so that production costs increase.

SUMMARY OF THE INVENTION

It is therefore an object of the present invention to eliminate the aforementioned problems and to provide an electronic part mounting substrate capable of mounting an electronic part, such as a semiconductor chip, on a metal/ceramic bonding substrate without using any solders, and a method for producing the same.

In order to accomplish the aforementioned and other objects, the inventors have diligently studied and found that it is possible to fix an electronic part, such as a semiconductor chip, to a metal/ceramic bonding substrate without using any solders, if the electronic part is bonded directly to one side of a metal plate for a circuit when the other side of the metal plate is bonded directly to one side of a ceramic substrate. Thus, the inventors have made the present invention.

According one aspect of the present invention, there is provided a method for producing an electronic part mounting substrate wherein a metal member is bonded to one side of a ceramic substrate, and one side of a metal plate is bonded to the other side of the ceramic substrate, an electronic part being mounted on the other side of the metal plate, the method comprising the steps of: arranging a ceramic substrate and an electronic part in a mold so that the ceramic substrate is spaced from the electronic part; injecting a molten metal into the mold so that the molten metal contacts both sides of the ceramic substrate and the electronic part; cooling the mold to solidify the molten metal, to form a metal member on one side of the ceramic substrate so that the metal member is bonded directly to the one side of the ceramic substrate, and to form a metal plate on the other side of the ceramic substrate so that one side of the metal plate is bonded directly to the other side of the ceramic substrate; and bonding the electronic part directly to the other side of the metal plate when the metal plate is formed.

In this method for producing an electronic part mounting substrate, the electronic part may be made of a material which does not produce any alloys or compounds with the molten metal. The electronic part may be a semiconductor chip, a resistor chip or a capacitor chip. The electronic part is preferably an SiC chip. The molten metal may be molten aluminum or a molten aluminum alloy.

The above described method may further comprise the steps of: taking a bonding substrate, wherein the ceramic substrate, the metal member, the metal plate and the electronic part are integrated with each other, out of the mold; and thereafter, forming an etching resist on a surface of the metal plate to form a circuit on the metal plate by etching. In this case, the etching may be carried out after the metal plate is machined.

According to another aspect of the present invention, there is provided a method for producing a power module, comprising the steps of: mounting a casing having electrodes on an electronic part mounting substrate which is produced by the above described method for producing an electronic part mounting substrate and wherein the electronic part is a semiconductor chip; connecting the electrodes of the casing to the semiconductor chip; and filling an insulating material in the casing.

According to a further aspect of the present invention, an electronic part mounting substrate comprises: a ceramic substrate; a metal member bonded to one side of the ceramic substrate; a metal plate, one side of which is bonded to the other side of the ceramic substrate; and an electronic part bonded directly to the other side of the metal plate.

In this electronic part mounting substrate, the electronic part may be bonded to the other side of the metal member when the metal plate is formed by solidifying a molten metal. The electronic part may be bonded to the other side of the metal plate without using any solders. The electronic part may be made of a material which does not produce any alloys or compounds with the molten metal. The electronic part may be a semiconductor chip, a resistor chip or a capacitor chip. The electronic part is preferably an SiC chip. The metal member and the metal plate may be made of aluminum or an aluminum alloy.

According to a still further aspect of the present invention, a power module comprises: the above described electronic part mounting substrate, wherein the electronic part is a semiconductor chip; a casing having electrodes, the casing being mounted on the electronic part mounting substrate, the electrodes of the casing being connected to the semiconductor chip; and an insulating material filled in the casing.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of an electronic part mounting substrate and a method for producing the same according to the present invention will be described below.

Figure 1:
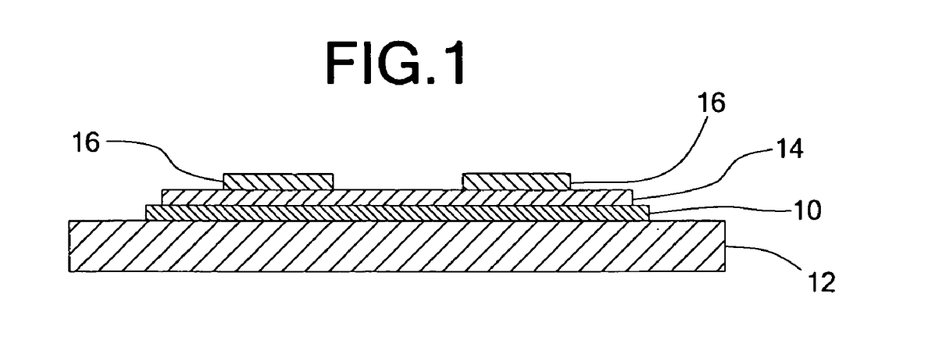
FIG. 1 is a sectional view schematically showing a preferred embodiment of an electronic part mounting substrate according to the present invention.

As shown in FIG. 1, an electronic part mounting substrate in this preferred embodiment comprises: a ceramic substrate 10; a heat sinking metal base plate 12 of aluminum or an aluminum alloy, which is bonded directly to one side of the ceramic substrate 10; a circuit forming metal plate 14 of aluminum or an aluminum alloy, which is bonded directly to the other side of the ceramic substrate 10; and electronic parts 16 bonded directly to the circuit forming metal plate 14.

Figure 2:
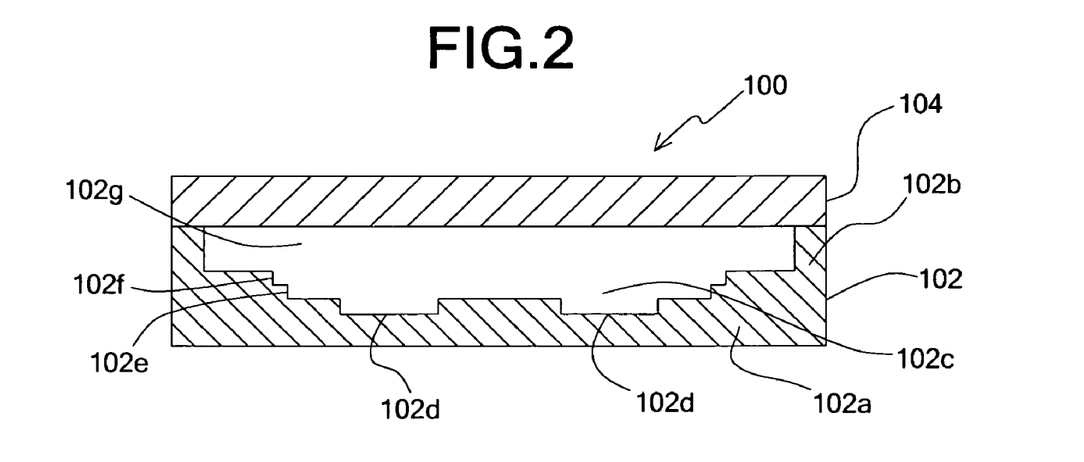
FIG. 2 is a sectional view of a mold for use in the preferred embodiment of a method for producing an electronic part mounting substrate according to the present invention.

The direct bonding between the ceramic substrate 10 and the heat sinking metal base plate 12, the direct bonding between the ceramic substrate 10 and the circuit forming metal plate 14, and the direct bonding between the circuit forming metal plate 14 and the electronic parts 16 are carried out by cooling a molten metal which is injected into a mold 100 shown in, e.g., FIG. 2.

As shown in FIG. 2, the mold 100 comprises a lower mold member 102 and an upper mold member 104. The lower mold member 102 comprises a bottom portion 102a having a rectangular planar shape, and a side wall portion 102b extending from the peripheral edge portion of the bottom portion 102a upwards in a direction perpendicular to the bottom portion 102a. The top surface of the bottom portion 102a of the lower mold member 102 has a recessed portion 102c which has a step-wise extending side wall. The recessed portion 102c comprises: one or a plurality of electronic part housing portions 102d (only two electronic part housing portions 102d are shown in FIG. 2), each of which substantially has the same shape and size as those of a corresponding one of the electronic parts 16; one or a plurality of metal circuit plate forming portions 102e (only one metal circuit plate forming portion 102e is shown in FIG. 2), each of which is formed above the electronic part housing portions 102d so as to be adjacent thereto and each of which substantially has the same shape and size as those of the circuit forming metal plate 14; and one or a plurality of ceramic substrate housing portions 102f (only one ceramic substrate housing portion 102f is shown in FIG. 2), each of which is formed above the metal circuit plate forming portion 102e so as to be adjacent thereto and each of which substantially has the same shape and size as those of the ceramic substrate 10. Of a space defined by putting the upper mold member 104 having a substantially rectangular planar shape on the lower mold member 102, a portion other than the recessed portion 102c of the lower mold member 102 defines a heat sinking metal base plate forming portion 102g having a shape corresponding to the shape of the heat sinking metal base plate 12. Furthermore, the upper mold member 104 has a molten metal inlet (not shown) for injecting a molten metal into the mold 100. The lower mold member 102 has a molten metal passage (not shown) extending between the heat sinking metal base plate forming portion 102g and the metal circuit plate forming portion 102e, so as to allow the heat sinking metal base plate forming portion 102g to be communicated with the metal circuit plate forming portion 102e if the ceramic substrate 10 is housed in the ceramic substrate housing portion 102f.

First, the electronic parts 16 are housed in the electronic part housing portions 102d of the lower mold member 102 of the mold 100, and the ceramic substrate 10 is housed in the ceramic substrate housing portion 102f thereof. Then, a molten metal is injected into the heat sinking metal base plate forming portion 102g to be filled in the metal circuit plate forming portion 102e via the molten metal passage (not shown). Thereafter, the molten metal is cooled to be solidified, so that it is possible to produce an electronic part mounting substrate wherein the ceramic substrate 10, the heat sinking metal base plate 12, the circuit forming metal plate 14 and the electronic parts 16 are bonded to and integrated with each other.

By thus bonding the electronic parts 16 directly to the circuit forming metal plate 14 of aluminum or an aluminum alloy without using any solders, it is possible to enhance thermal conductivity to improve heat sink characteristics. In addition, it is difficult to produce voids which are easily produced when a solder is used, and the thermal conductivity of aluminum or an aluminum alloy is higher than that of solders, so that it is possible to improve heat sink characteristics and reliability. In addition, it is not required to use any high-temperature solders which are difficult to be lead-free solders, so that the electronic part mounting substrate can be lead-free. Moreover, it is not required to plate the circuit forming metal plate 14 in order to improve solder wettability. Furthermore, the electronic parts 16 may be any electronic parts, such as semiconductor chips, resistor chips and capacitor chips, unless they are reacted with a molten metal to produce any alloys or compounds.

Referring to the accompanying drawings, a power module using a preferred embodiment of an electronic part mounting substrate and a method for producing the same according to the present invention will be described below.

Figure 3:
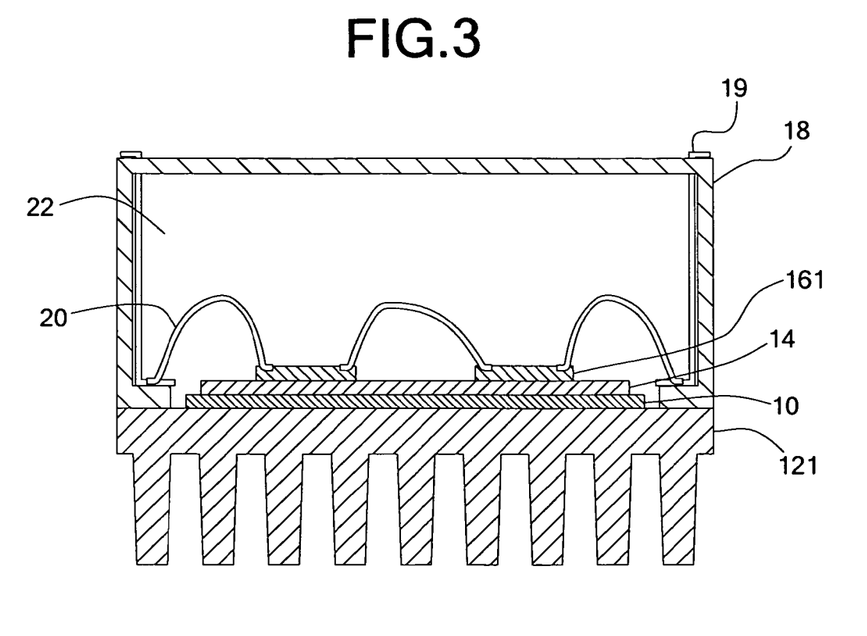
FIG. 3 is a sectional view schematically showing a power module using the preferred embodiment of an electronic part mounting substrate according to the present invention.

As shown in FIG. 3, this power module comprises: a ceramic substrate 10; a heat sinking metal base plate 121 with cooling fins, which is bonded directly to one side of the ceramic substrate 10 and which is made of aluminum or an aluminum alloy; a circuit forming metal plate 14 which is bonded directly to the other side of the ceramic substrate 10 and which is made of aluminum or an aluminum alloy; semiconductor chips 161, such as SiC chips, which are bonded directly to the circuit forming metal plate 14; a casing 18 which is mounted on the heat sinking metal base plate 12 so as to surround the ceramic substrate 10, the circuit forming metal plate 14 and the semiconductor chips 161; aluminum wires 20 which connect the semiconductor chips 161 to the electrodes 19 of the casing 18; and an insulating resin 22 which is filled in the casing 18.

Figure 4:
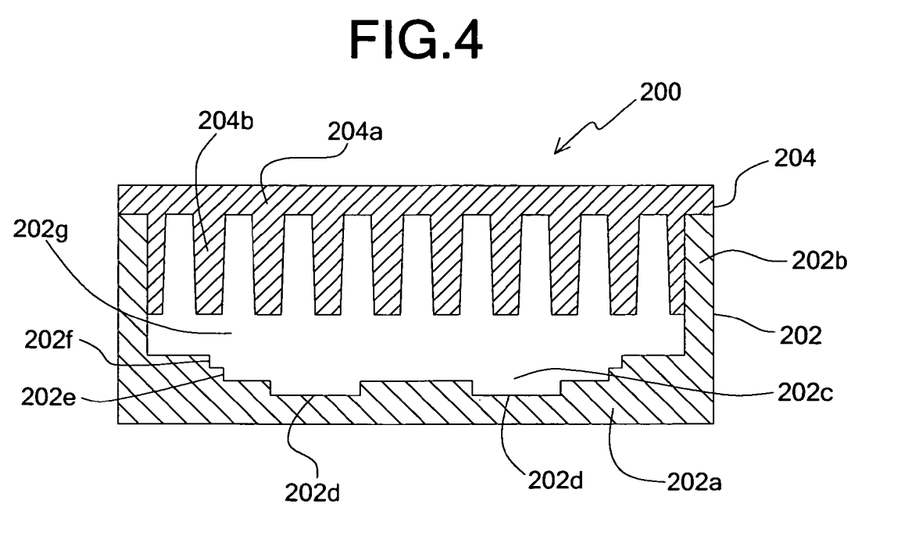
FIG. 4 is a sectional view of a mold used for producing the power module using the preferred embodiment of an electronic part mounting substrate according to the present invention.

The direct bonding between the ceramic substrate 10 and the heat sinking metal base plate 12, the direct bonding between the ceramic substrate 10 and the circuit forming metal plate 14, and the direct bonding between the circuit forming metal plate 14 and the semiconductor chips 16 are carried out by cooling a molten metal which is injected into a mold 200 shown in, e.g., FIG. 4.

As shown in FIG. 4, the mold 200 comprises a lower mold member 202 and an upper mold member 204. The lower mold member 202 comprises a bottom portion 202a having a rectangular planar shape, and a side wall portion 202b extending from the peripheral edge portion of the bottom portion 202a upwards in a direction perpendicular to the bottom portion 202a. The top surface of the bottom portion 202a of the lower mold member 202 has a recessed portion 202c which has a step-wise extending side wall. The recessed portion 202c comprises: one or a plurality of semiconductor chip housing portions 202d (only two semiconductor chip housing portions 202d are shown in FIG. 4), each of which substantially has the same shape and size as those of a corresponding one of the semiconductor chips 161; one or a plurality of metal circuit plate forming portions 202e (only one metal circuit plate forming portion 202e is shown in FIG. 4), each of which is formed above the semiconductor chip housing portions 102d so as to be adjacent there to and each of which substantially has the same shape and size as those of the circuit forming metal plate 14; and one or a plurality of ceramic substrate housing portions 202f (only one ceramic substrate housing portion 202f is shown in FIG. 4), each of which is formed above the metal circuit plate forming portion 202e so as to be adjacent thereto and each of which substantially has the same shape and size as those of the ceramic substrate 10. The upper mold member 204 comprises: an upper mold body 204a having a substantially rectangular planar shape; and a plurality of fin forming portions 204b which extend downwards from the bottom surface of the upper mold body 204a in a direction perpendicular thereto and which are spaced at regular intervals to extend in parallel to each other. Of a space defined by putting the upper mold member 204 on the lower mold member 202, a portion other than the recessed portion 202c of the lower mold member 202 defines a heat sinking metal base plate forming portion 202g having a shape corresponding to the shape of the heat sinking metal base plate 121 with cooling fins. Furthermore, the upper mold member 204 has a molten metal inlet (not shown) for injecting a molten metal into the mold 200. The lower mold member 202 has a molten metal passage (not shown) extending between the heat sinking metal base plate forming portion 202g and the metal circuit plate forming portion 202e, so as to allow the heat sinking metal base plate forming portion 202g to be communicated with the metal circuit plate forming portion 202e if the ceramic substrate 10 is housed in the ceramic substrate housing portion 202f.

First, the semiconductor chips 161 are housed in the semiconductor chip housing portions 202d of the lower mold member 202 of the mold 200, and the ceramic substrate 10 is housed in the ceramic substrate housing portion 202f thereof. Then, a molten metal is injected into the heat sinking metal base plate forming portion 202g to be filled in the metal circuit plate forming portion 202e via the molten metal passage (not shown). Thereafter, the molten metal is cooled to be solidified, so that the ceramic substrate 10, the heat sinking metal base plate 121, the circuit forming metal plate 14 and the semiconductor chips 161 can be bonded to and integrated with each other.

Examples of an electronic part mounting substrate and a method for producing the same according to the present invention will be described below in detail.

EXAMPLE 1

Figure 5A:
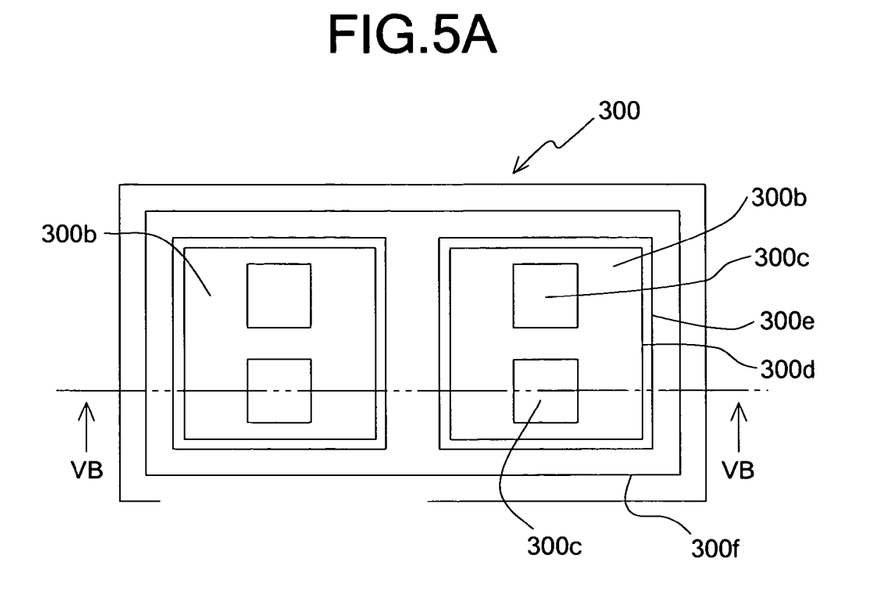
FIG. 5A is a plan view of a lower mold member of a mold for producing a bonding article for use in an electronic part mounting substrate in Example 1.
Figure 5B:
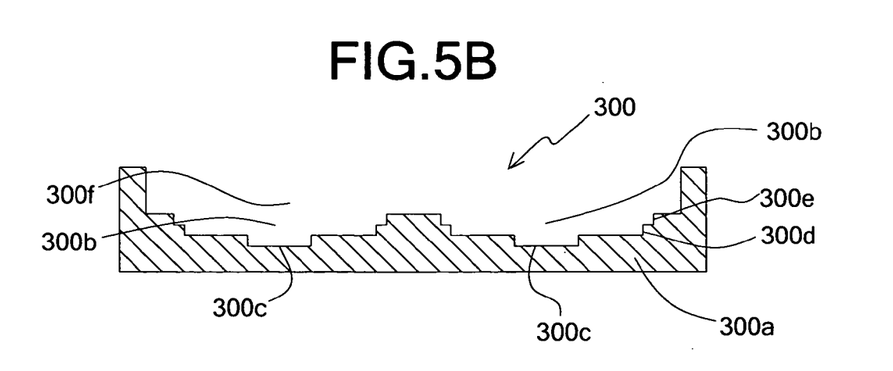
FIG. 5B is a sectional view taken along line VB—VB of FIG. 5A.

First, as shown in FIGS. 5A and 5B, a carbon mold having a lower mold member 300 was prepared as a mold. The lower mold member 300 has a bottom portion 300a having a substantially rectangular planar shape. The top surface of the bottom portion 300a of the lower mold member 300 has two recessed portions 300b which are spaced from each others by 10 mm and each of which has a step-wise extending side wall. Each of the recessed portions 300b comprises: two semiconductor chip housing portions 300c, each of which substantially has the same shape and size as those of a semiconductor chip having a size of 10 mm×10 mm×1.5 mm so as to be capable of housing therein the semiconductor chip; metal circuit plate forming portions 300d, each of which is formed above the corresponding semiconductor chip housing portions 300c so as to be adjacent thereto and each of which is capable of forming a circuit forming metal plate having a size of 39 mm×39 mm×0.4 mm on the semiconductor chip; and two ceramic substrate housing portion 300*e*, each of which is formed above the metal circuit plate forming portion 300*d* so as to be adjacent thereto and each of which substantially has the same shape and size as those of a ceramic substrate having a size of 40 mm×40 mm×0.635 mm so as to be capable of housing therein the ceramic substrate above the metal circuit plate forming portion 300*d*. When an upper mold member (not shown) having a substantially rectangular planar shape is put on the lower mold member 300, there is formed a heat sinking metal base plate forming portion 300*f* having such a shape and size that a heat sinking metal base plate having a size of 110 mm×60 mm×5 mm can be formed on the ceramic substrate so as to be adjacent thereto. Furthermore, the upper mold member of the mold has a molten metal inlet (not shown) for injecting a molten metal into the mold. The lower mold member 300 has a molten metal passage (not shown) extending between the heat sinking metal base plate forming portion 300*f* and the metal circuit plate forming portion 300*d*, so as to allow the heat sinking metal base plate forming portion 300*f* to be communicated with the metal circuit plate forming portion 300*d* if the ceramic substrate is housed in the ceramic substrate housing portion 300*e*.

Figure 5C:
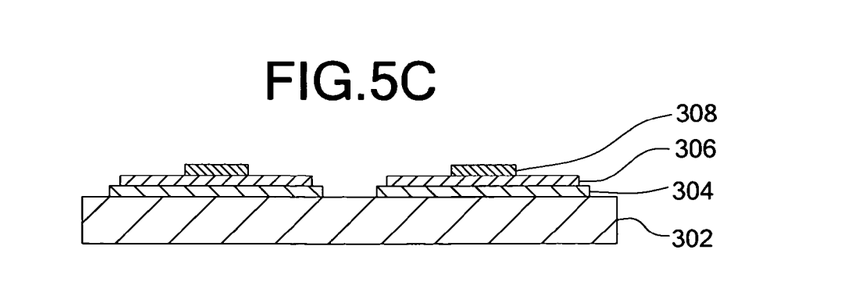
FIG. 5C is a sectional view of a bonding article produced by the mold of FIG. 5A.

Then, four SiC chips having a size of 10 mm×10 mm×1.5 mm were housed in the semiconductor chip housing portions 300*c* of the lower mold member 300 of the mold, and two aluminum nitride substrates having a size of 40 mm×40 mm×0.635 mm were housed in the ceramic substrate housing portions 300*e* thereof. Then, the lower mold member 300 was covered with the upper mold member to be put in a furnace, and the atmosphere in the furnace was caused to be a nitride atmosphere having an oxygen concentration of 100 ppm or less. In this state, molten aluminum having a purity of 4N was injected into the mold while removing oxide films by applying a pressure by means of a carbon cylinder (not shown). Thereafter, the mold was cooled to solidify aluminum, and further cooled to a room temperature. Thus, as shown in FIG. 5C, there was produced a bonding article wherein one side of each of two ceramic substrates 304 was bonded directly to an aluminum base plate 302 having a size of 110 mm×60 mm×5 mm, and one side of a circuit forming aluminum plate 306 having a size of 39 mm×39 mm×0.4 mm was bonded directly to the other side of each of the ceramic substrates 304, two SiC chips 308 being bonded directly to the other side of each of the circuit forming aluminum plates 306, and then, the bonding article was taken out of the mold.

Thereafter, an etching resist having a predetermined shape was printed on the surface of each of the circuit aluminum plates 306 to carry out an etching process with an aqueous ferric chloride solution to form a circuit pattern, and then, the resist was removed.

With respect to the bonding article thus obtained, the bonding interface between the SiC chip 308 and the aluminum circuit plate 306, the bonding interface between the aluminum circuit plate 306 and the ceramic substrate 304, and the bonding interface between the ceramic substrate 304 and the aluminum base plate 302 were examined by an ultrasonic detector. Then, no bonding failure was detected, and no crack was observed on the ceramic substrate 304.

With respect to the bonding article, after heat cycles (in one heat cycle, the article was held at −40° C. for 30 minutes, at 25° C. for 10 minutes, at 125° C. for 30 minutes, and at 20° C. for 10 minutes) were repeatedly carried out three thousands times, each of the above described bonding interfaces was examined by the ultrasonic detector. Then, no bonding failure was detected, and no crack was observed on the ceramic substrate 304.

EXAMPLE 2

Figure 6A:
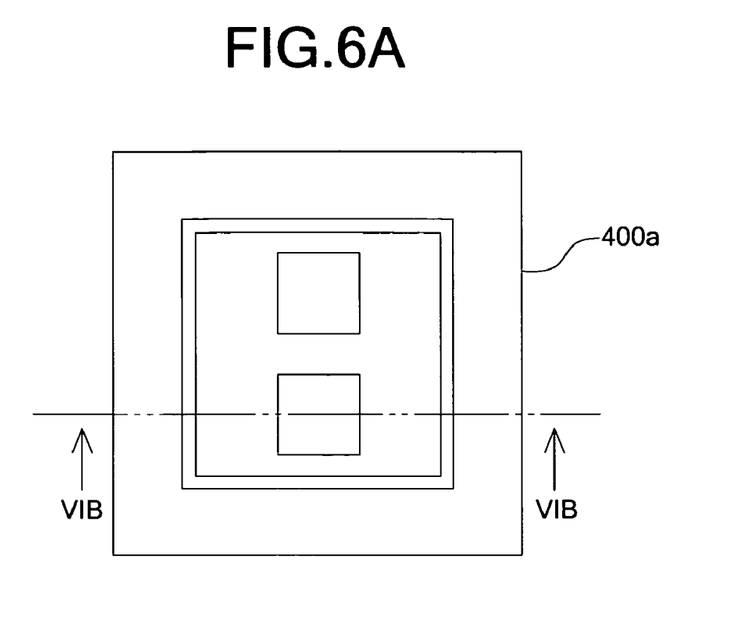
FIG. 6A is a plan view of a lower mold member of a mold for producing a bonding article for use in an electronic part mounting substrate in Example 2.
Figure 6B:
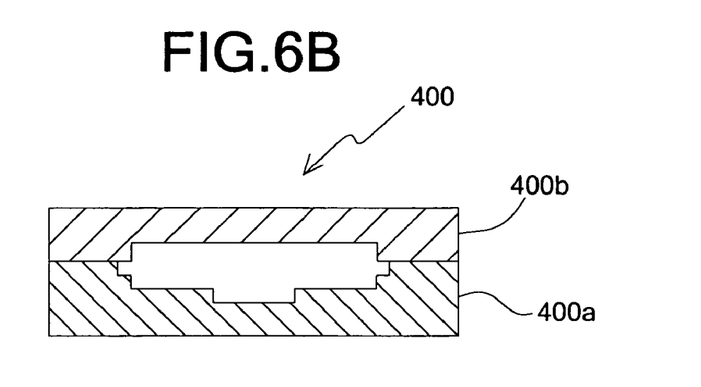
FIG. 6B is a sectional view of the lower mold member taken along line VIB—VIB of FIG. 6A, which also shows a cross section of an upper mold member covering the lower mold member to form the mold.
Figure 6C:
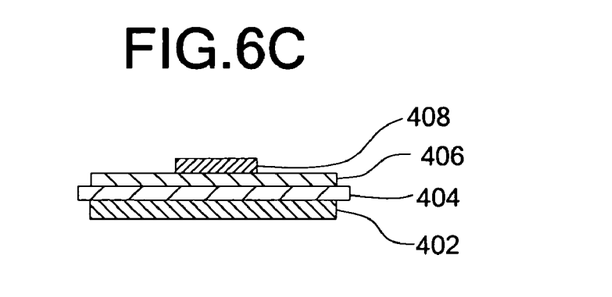
FIG. 6C is a sectional view of a bonding article produced by the mold of FIG. 6B.

As shown in FIG. 6C, after a bonding article was produced by the same method as that in Example 1, using a mold 400 (see FIGS. 6A and 6B) comprising a lower mold member 400*a* and an upper mold member 400*b* for producing the same bonding article as that in Example 1, except that a circuit forming metal plate 406 was bonded to one side of a ceramic substrate 404 and that a heat sinking metal plate 402 having a size of 39 mm×39 mm×1.0 mm was bonded on the other side thereof, the same etching process as that in Example 1 was carried out.

With respect to the bonding article thus obtained, the bonding interface between the SiC chip 408 and the aluminum circuit plate 406, the bonding interface between the aluminum circuit plate 406 and the ceramic substrate 404, and the bonding interface between the ceramic substrate 404 and the aluminum heat sink plate 402 were examined by an ultrasonic detector. Then, no bonding failure was detected, and no crack was observed on the ceramic substrate 404.

With respect to the bonding article, after the same heat cycles as those in Example 1 were repeatedly carried out three thousands times, each of the above described bonding interfaces was examined by the ultrasonic detector. Then, no bonding failure was detected, and no crack was observed on the ceramic substrate 404.

EXAMPLE 3

Figure 7A:
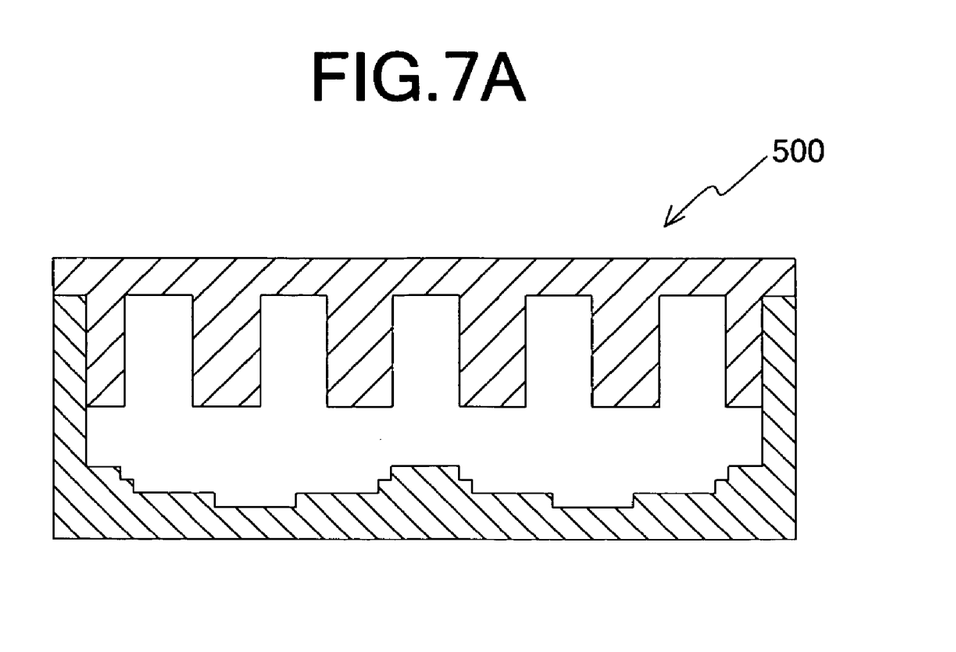
FIG. 7A is a sectional view of a mold for producing a bonding article for use in an electronic part mounting substrate in Example 3.
Figure 7B:
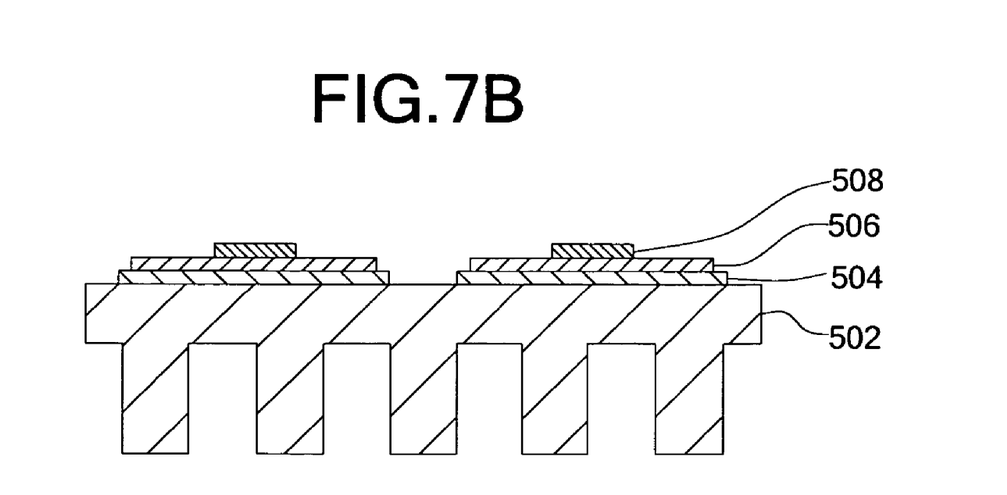
FIG. 7B is a sectional view of a bonding article produced by the mold of FIG. 7A.

As shown in FIG. 7B after a bonding article was produced by the same method as that in Example 1, using a mold 500 (see FIG. 7A) for producing the same bonding article as that in Example 1, except that a plurality of fins having a width of 3 mm and a height of 10 mm were formed at an interval of 10 mm on the reverse of a heat sinking metal base plate, the same etching process as that in Example 1 was carried out.

With respect to the bonding article thus obtained, the bonding interface between the SiC chip 508 and the aluminum circuit plate 506, the bonding interface between the aluminum circuit plate 506 and the ceramic substrate 504, and the bonding interface between the ceramic substrate 504 and the aluminum base plate 502 were examined by an ultrasonic detector. Then, no bonding failure was detected, and no crack was observed on the ceramic substrate 504.

With respect to the bonding article, after the same heat cycles as those in Example 1 were repeatedly carried out three thousands times, each of the above described bonding interfaces was examined by the ultrasonic detector. Then, no bonding failure was detected, and no crack was observed on the ceramic substrate 504.

As described above, according to the present invention, it is possible to produce an electronic part mounting substrate wherein electronic parts, such as semiconductor chips, are mounted on a metal/ceramic bonding substrate without using any solders.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing an electronic part mounting substrate wherein a metal member is bonded to one side of a ceramic substrate, and one side of a metal plate is bonded to the other side of the ceramic substrate, an electronic part being mounted on the other side of the metal plate, said method comprising the steps of:

arranging a ceramic substrate and an electronic part in a mold so that the ceramic substrate is spaced from the electronic part;

injecting a molten metal into the mold so that the molten metal contacts both sides of the ceramic substrate and the electronic part;

cooling the mold to solidify the molten metal, to form a metal member on one side of the ceramic substrate so that the metal member is bonded directly to the one side of the ceramic substrate, and to form a metal plate on the other side of the ceramic substrate so that one side of the metal plate is bonded directly to the other side of the ceramic substrate; and bonding the electronic part directly to the other side of the metal plate when the metal plate is formed.

2. A method for producing an electronic part mounting substrate as set forth in claim 1, wherein said electronic part is made of a material which does not produce any alloys or compounds with said molten metal.

3. A method for producing an electronic part mounting substrate as set forth in claim 1, wherein said electronic part is a semiconductor chip, a resistor chip or a capacitor chip.

4. A method for producing an electronic part mounting substrate as set forth in claim 1, wherein said electronic part is an SiC chip.

5. A method for producing an electronic part mounting substrate as set forth in claim 1, wherein said molten metal is molten aluminum or a molten aluminum alloy.

6. A method for producing a power module, comprising the steps of:

mounting a casing having electrodes on an electronic part mounting substrate which is produced by a method for producing an electronic part mounting substrate as set forth in claim 1 and wherein said electronic part is a semiconductor chip;

connecting said electrodes of the casing to said semiconductor chip; and filling an insulating material in said casing.

7. A method for producing an electronic part mounting substrate as set forth in claim 1, which further comprises the steps of:

taking a bonding substrate, wherein said ceramic substrate, said metal member, said metal plate and said electronic part are integrated with each other, out of said mold; and thereafter, forming an etching resist on a surface of said metal plate to form a circuit on said metal plate by etching.

8. A method for producing an electronic part mounting substrate as set forth in claim 7, wherein said etching is carried out after said metal plate is machined.

* * * * *